(12) United States Patent
Pschenitzka et al.

(10) Patent No.: US 12,193,249 B2
(45) Date of Patent: Jan. 7, 2025

(54) MULTI-LAYER DISPLAY STRUCTURE

(71) Applicant: Kateeva, Inc., Newark, CA (US)

(72) Inventors: Florian Pschenitzka, San Francisco, CA (US); Michael Morse, San Jose, CA (US); Teresa Ramos, San Jose, CA (US)

(73) Assignee: Kateeva, Inc., Newark, CA (US)

( * ) Notice: Subject to any disclaimer, the term of this patent is extended or adjusted under 35 U.S.C. 154(b) by 370 days.

(21) Appl. No.: 17/594,101

(22) PCT Filed: Apr. 20, 2020

(86) PCT No.: PCT/US2020/028906
§ 371 (c)(1),
(2) Date: Oct. 1, 2021

(87) PCT Pub. No.: WO2020/242636
PCT Pub. Date: Dec. 3, 2020

(65) Prior Publication Data
US 2022/0216443 A1   Jul. 7, 2022

Related U.S. Application Data

(60) Provisional application No. 62/855,022, filed on May 31, 2019.

(51) Int. Cl.
*H10K 59/38* (2023.01)
*H10K 50/115* (2023.01)
(Continued)

(52) U.S. Cl.
CPC ......... *H10K 50/115* (2023.02); *H10K 50/858* (2023.02); *H10K 59/38* (2023.02); *H10K 71/00* (2023.02)

(58) Field of Classification Search
CPC .... H10K 50/115; H10K 50/858; H10K 59/38; H10K 71/00; H10K 59/879; H10K 59/35;
(Continued)

(56) References Cited

U.S. PATENT DOCUMENTS 5,845,025 A   12/1998   Garito et al.
8,765,014 B2   7/2014   Cho et al.
(Continued)

FOREIGN PATENT DOCUMENTS

EP      3244442 A1   11/2017
KR    101958721 B1    3/2019

OTHER PUBLICATIONS

International Search Report and Written Opinion issued Jul. 22, 2020 for International Application No. PCT/US2020/028906 [PCT-18-0416-PCT].
(Continued)

*Primary Examiner* — Elias Ullah
(74) *Attorney, Agent, or Firm* — Hauptman Ham, LLP

(57) ABSTRACT

A display device that uses one or more light coupling layers is described herein, along with methods of making such devices. One device includes an array of blue light emitting elements formed on a substrate, a light coupling material formed over the array of blue light emitting elements, and a quantum dot light converting material disposed in a portion of a pixel structure formed over the array of blue light emitting elements. The light coupling material has a high refractive index and may be, or include, a polymer material.

16 Claims, 6 Drawing Sheets

(51) Int. Cl.
*H10K 50/858* (2023.01)
*H10K 71/00* (2023.01)

(58) Field of Classification Search
CPC .............. H10K 2102/331; B82Y 20/00; H01L 27/156; H01L 33/504
See application file for complete search history.

(56) References Cited

U.S. PATENT DOCUMENTS

| | | |
|---|---|---|
| 2010/0283036 A1 | 11/2010 | Coe-Sullivan et al. |
| 2017/0227813 A1 | 8/2017 | Park et al. |
| 2018/0072949 A1 | 3/2018 | Satake et al. |
| 2018/0102449 A1 | 4/2018 | Pschenitzka et al. |
| 2018/0284531 A1 | 10/2018 | Chen et al. |
| 2018/0323352 A1 | 11/2018 | Takano et al. |
| 2019/0058013 A1 | 2/2019 | Lee |
| 2020/0161585 A1* | 5/2020 | Palles-Dimmock ........................ H10K 85/1135 |

OTHER PUBLICATIONS

Anonymous, Wikipedia, The Free Encyclopedia, 2004, Polycarbonate.
Extended Supplementary EP Search Report Issued Jun. 23, 2023 for EP Patent Application No. 208148098.
Nakamura, The Roles of Structural Imperfections in a InGaN-Based Blue Light Emitting Diodes and Laser Diodes, Science, vol. 281, Aug. 14, 1998.

* cited by examiner

MULTI-LAYER DISPLAY STRUCTURE

FIELD

Embodiments of the present invention generally relate to display devices. Specifically, display devices and methods of making display devices having multi-layer structures with high index materials are described.

BACKGROUND

Video display devices are ubiquitous. Improvement in video display technologies generally follows three trends: 1) increasing size of the display; 2) increasing light output of the display; and 3) improving quality of the light emitted by the display. All three trends bring challenges. Increasing size of the display generally requires that quality and function not suffer as size increases. Increasing light output of the display involves getting more photons from each display element, or pixel, without losing quality. Improving quality of the light emitted by the display generally involves contrast, color sharpness, spectral luminosity, emission angle optimization, and focus without losing overall brightness or power efficiency. Video displays are generally made up of a number of material layers. Between the light-emitting elements and the exit layer, there are a number of opportunities to lose photons. There is a need for displays, and methods of making displays, with minimal photon loss.

SUMMARY

Embodiments described herein provide a display comprising an array of blue light emitting elements formed in a pixel structure, a light coupling material formed over the array of blue light emitting elements, and a quantum dot light converting material disposed in a portion of the pixel structure between the array of blue light emitting elements and the light coupling material.

Other embodiments described herein provide a display comprising a pixelated array of blue light emitting elements, a sub-pixel array defined on the pixelated array, a quantum dot light converting material disposed in a portion of the sub-pixels, a top, and a light coupling material disposed between the quantum dot light converting material and the top.

Other embodiments described herein provide a method of making a display, comprising forming a pixelated blue light emitting structure on a substrate, depositing a quantum dot material on a first portion of the pixelated blue light emitting structure, depositing a light conditioning material on a second portion of the pixelated blue light emitting structure, and depositing a light coupling material over the quantum dot material and the light conditioning material.

Other embodiments described herein provide a method of making a display, comprising forming a pixelated blue light emitting structure on a first substrate, inkjet printing a pixelated quantum dot material on a first portion of a second substrate, inkjet printing a pixelated light conditioning material on a second portion of the second substrate, inkjet printing a light coupling material over the quantum dot material and the light conditioning material that includes aromatic components or hetero-atoms, and attaching the light coupling material of the second substrate to the pixelated blue light emitting structure of the first substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

To increase light output of a display device, light coupling layers are used to minimize photon losses at material interfaces. The light coupling layers are typically polymeric materials or particle dispersions within a polymeric matrix that can be deposited as a liquid in a thin layer and then solidified using a convenient process such as drying or curing. In specific embodiments, a light coupling layer is disposed between one or more light-emitting layers and one or more color conditioning layers, or between one or more color conditioning layers and one or more top layers of a display device. The light coupling layer can be a layer having thickness less than about 20 μm to facilitate photon transition across the interface, or the light coupling layer can be a material having refractive index above about 1.5. To achieve high refractive indices in organic polymers, precursors having aromatic components or hetero-atoms such as sulfur and phosphorus are used.

Figure 1:
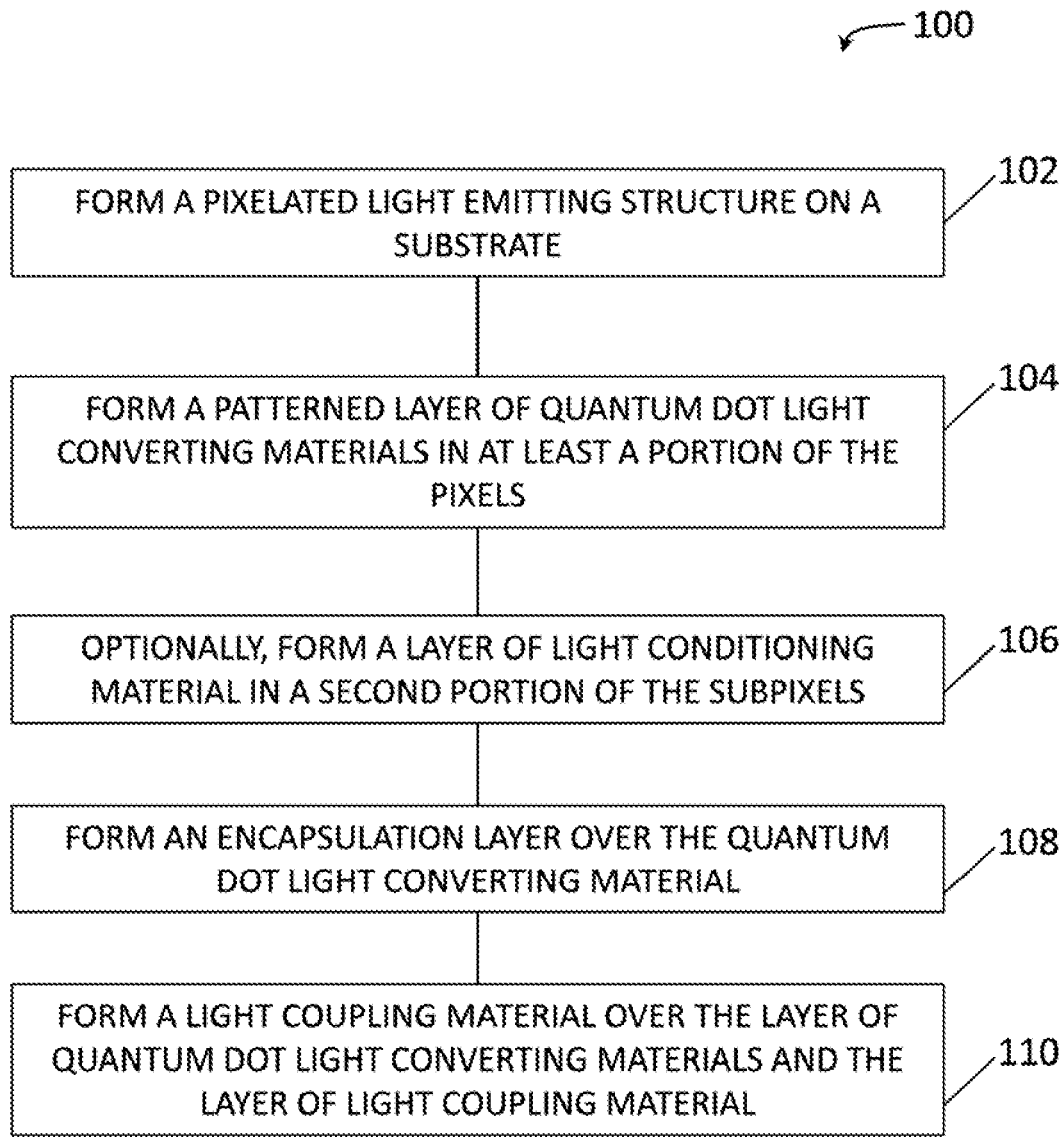
FIG. 1 is a flow diagram summarizing a method according to one embodiment.
Figure 2A:
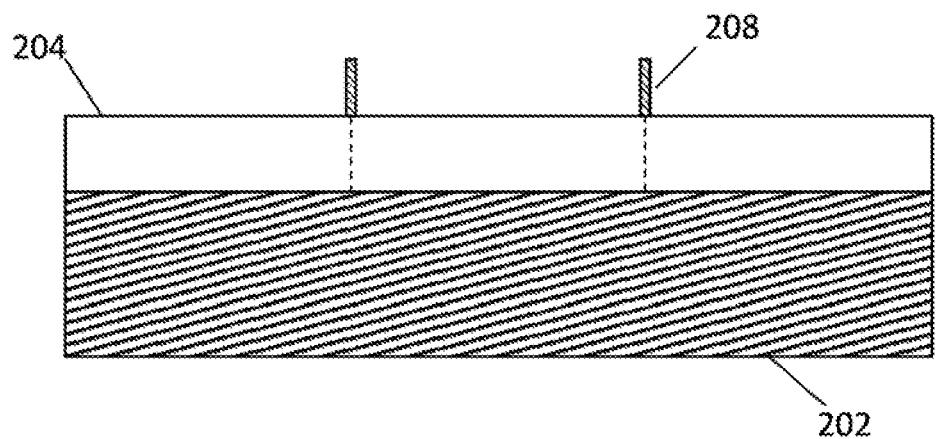
FIGS. 2A-2C are schematic cross-sectional views of a display device embodiment being manufactured according to the method of FIG. 1.
Figure 2B:
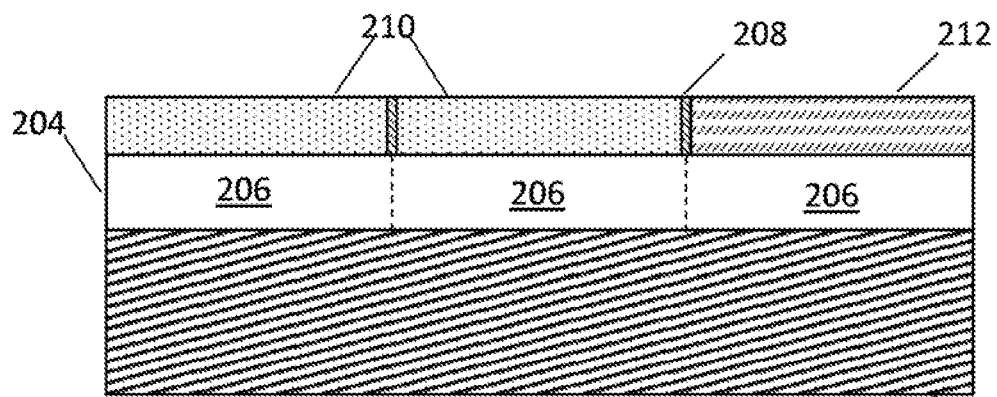
Figure 2C:
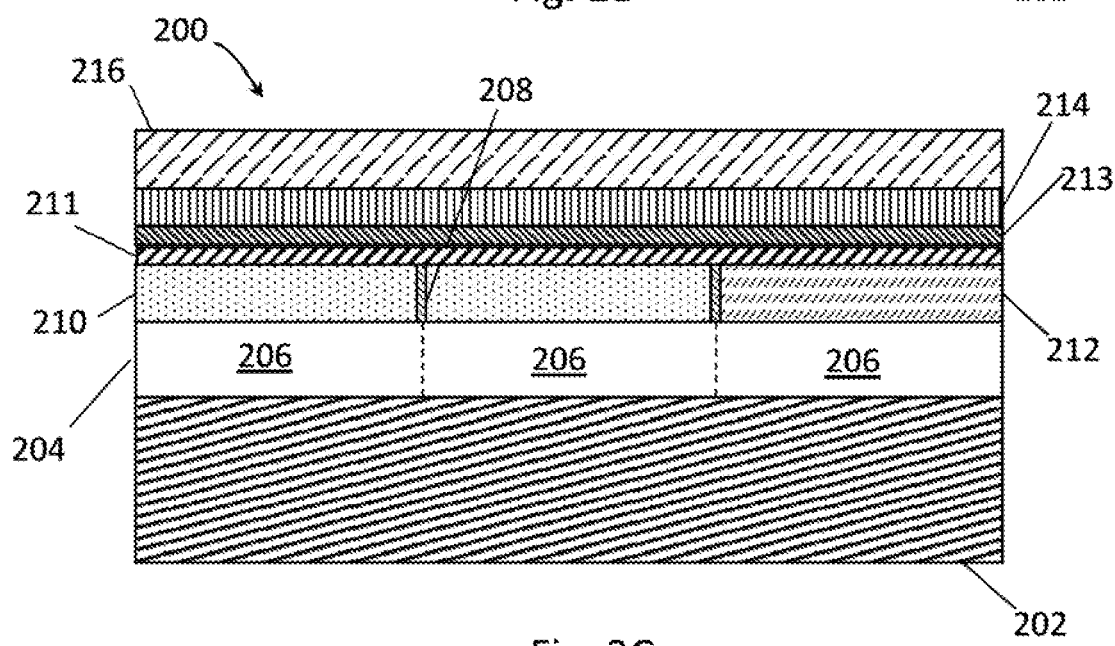

FIG. 1 is a flow diagram summarizing a method 100 according to one embodiment. The method 100 is a method of making a display device. Layers of the display device are generally formed on a substrate by depositing or laminating materials onto the substrate. FIGS. 2A-2C are schematic views of a display device 200 (FIG. 2C) manufactured according to the method 100 at various stages of the process.

At 102, a pixelated light emitting structure is formed on a substrate. The light emitting structure is formed as a layer on the substrate, and pixels may be defined by a pattern of energizing structures, for example power contacts, in the substrate or by physical boundaries formed on the substrate such as a patterned pixel layer.

The pixelated light emitting structure has light emitting elements formed from electroluminescent materials such as organic light-emitting materials, quantum well materials, and the like. In one example, the pixelated light emitting structure is a layer of organic light emitting diodes that emit blue light, for example using fluorescent materials such as fluorene-based compounds, triphenylamine-based compounds, and/or other highly conjugated compounds that can be assembled into a network. The device in FIG. 2A has a light emitting layer 204 formed on a substrate 202. The substrate can be any structurally suitable material capable of supporting a display device, for example glass or plastic.

In addition to the light emitting material itself, the light emitting layer 204 typically also includes charge injection and transport layers positioned between two electrodes. At least one of the electrodes is substantially transparent to allow photons to travel out of the light generating structure. Transparent electrodes such as ITO are frequently used. ITO has a refractive index of 1.8 to 2.0, depending on the exact composition and structure of the material, which can cause photon loss as photons travel across a material interface from the ITO to layers having lower refractive indices.

The light emitting layer 204 is divided into pixels which are further divided into subpixels. Three subpixels 206 are defined for each pixel. One pixel is shown in FIG. 2A.

The subpixels 206 may be defined by physical barriers, but in this case there are no physical barriers between the subpixels 206. Here the subpixel definition is indicated by a dotted line between the subpixels 206. The subpixel definition is either a physical barrier or a region with low surface energy on the surface of the subpixel. An example of a physical barrier is a photo patterned polymer layer. An example of a low surface energy region is a fluorinated compound adhered to the surface of the subpixel. In both cases, the function of this element is to contain layers deposited subsequently on the light emitting material, for example quantum dot light converting materials or light conditioning materials described further below.

At 104, a quantum dot light converting material is disposed in at least a portion of the pixels. FIG. 2B shows a quantum dot light converting material 210 disposed in a portion of the subpixels 206. Here, two quantum dot light converting materials 210 are formed in two subpixels 206, but in the general case, a plurality of quantum dot light converting materials 210 are formed in or on at least a portion of all the subpixels 206. The quantum dot light converting material absorbs light from the light-emitting structure, and emits light of a different wavelength from that absorbed. Red pixels are made by including quantum dots that absorb light, for example blue light, from the light-emitting structure and emit red light. Green pixels are made by including quantum dots that emit green light. The quantum dot light converting material is a polymeric material that has quantum dots distributed throughout in a substantially uniform distribution. The quantum dot light converting material is formed by depositing a precursor material that includes the quantum dots and polymerization precursors, and then solidifying the precursor material to form the quantum dot light converting material. Solidifying the precursor material may include curing the precursor material or drying the precursor material. In a curing process, the precursor material includes monomers and pre-polymers that polymerize during the curing process to form the solid quantum dot light converting material. The curing process can be based on thermal or radiant energy input, for example by UV radiation. In a drying process, the precursor material includes polymers that are expanded and softened using solvents. Drying evaporates the solvent, for example under vacuum, to produce the solid quantum dot light converting material.

In some cases, the portion of the pixels in which the quantum dot light converting material is formed is a first portion, and a light conditioning material is disposed in a second portion of the pixels at 106. FIG. 2B shows a light conditioning material 212 formed in one of the pixels 206. The light conditioning material is free of quantum dots, so that blue light passing through the light conditioning material is not converted to another wavelength. Where the light-emitting structure emits a different type of light, for example white light, all the pixels may have quantum dot light converting materials disposed therein. Here, where the emitted light is blue, a blue pixel can be formed without any conversion of light.

Each of the quantum dot light converting materials 210 and the light conditioning material 212 may include scattering particles, which may be ceramic particles such as titania, alumina, or zirconia, or which may be metal particles such as silver nanoparticles. The scattering particles typically have dimensions of 50 nm to 500 nm, for example 130 nm. The scattering particles increase absorption of photons by quantum dots by increasing opportunities for interaction between quantum dots and photons. The scattering particles also increase dispersion of light exiting the quantum dot and light conditioning materials to provide a desired viewing angle.

The quantum dot light converting materials 210 and the light conditioning material 212 is deposited in a patterned fashion. These materials can be deposited in a patterned fashion using inkjet printing, in which selected volumes of material are deposited only at selected locations to form a patterned film. Other deposition methods that may be used include continuous film deposition methods such as spin-coating or slot-die-coating followed by patterning such as photo-patterning or laser patterning.

At 108, an encapsulation layer is formed over the quantum dot light converting material, and optionally over the light conditioning material, if such material is used. The encapsulation layer protects sensitive materials in the subjacent layers from being adversely affected by subsequent processes. The encapsulation layer is typically silicon nitride, and may have a coating of silicon oxide on one or more of the lower and upper surfaces of the layer. FIG. 2C shows an encapsulation layer 213 formed over both the quantum dot light converting material 210 and the light conditioning material 212. The silicon nitride, and optional silicon oxide coatings, can be formed by PECVD.

An optional light filter 211 is also shown in FIG. 2C over the quantum dot light converting material 210 and the light conditioning material 212. The light filter 211 can be used to control the amount of light output of the light emitting structure 204 through the pixels 206 and subpixels to balance color output among the different pixels and subpixels. The light filter 211 can also be used to prevent excitation of quantum dots by ambient light. The light filter 211 can be deposited as a blanket layer, as shown in FIG. 2C, or as a pixelated structure where different materials and/or thicknesses can be used for different pixels to achieve different filtering characteristics, for example to tailor the filter to red, green, or blue pixels. In this way, light emission of the display can be fine-tuned.

The light filter 211 can be a blue color filter or a UV filter, or both. The light filter 211 can be formed as a blanket layer using any blanket deposition process, including inkjet printing. If the light filter 211 is formed as a pixelated structure, inkjet printing can be an advantageous method of forming such a structure. Different thicknesses can be used to provide more or less light filtering. For example, a first light filter pixel formed over a red color pixel can include a blue light filter material, and can be formed with a first thickness selected to filter essentially all blue light that might pass through the red color pixel. A second light filter pixel including the same blue light filter material can be formed over a green color pixel with a second thickness, different from the first thickness and selected to filter essentially all blue light that might pass through the green color pixel. The second thickness may need to be different because the green color pixel may have different absorption characteristics than the red color pixel with respect to blue light. For a blue color pixel, a third light filter pixel can be formed using the same filter material with a third thickness that is selected to balance blue light from the blue color pixel with red light from the red color pixel and green light from the green color pixel. The third thickness is typically substantially lower than the first and second thicknesses because the blue pixel is intended to emit blue light. In this example, all three light filters are formed from the same material, but different materials could be used for the three light filters. For example, the three materials may have the same curable precursor material and blue filter material, but the concentration of the blue filter material in the three light filters may be different, and may be selected to allow workable thicknesses to be used for the three light filters. For example, a lower concentration of blue filter material may be used for the precursor of the third light filter to enable a workable thickness with a selected low level of blue light filtering functionality to tune blue light output.

The light filter 211 is typically a polymeric material containing a material that absorbs or reflects blue light and/or UV light. For absorption, blue or UV absorbing dyes can be included in the polymeric material by introducing such dyes into a precursor material before polymerization. The dye function can be attached to a polymerizable olefin bond for covalent incorporation into the polymer, or the dye can be dispersed in the polymer without covalent incorporation. Alternately, a light filter component such as the blue color filter materials or UV filter materials described above can be included in the quantum dot light converting material 210 and/or the light conditioning material 212 for the same purpose. Reflection can be accomplished using Bragg structures with alternating refractive indices selected to reflect blue or UV light, or both. In one method, such structures can be included in the devices described herein by laminating into the structure.

At 110, a light coupling material is formed over the light-emitting structure, with the quantum dot light converting material between the array of light emitting elements and the light coupling material. FIG. 2C shows a light coupling material 214 formed over the quantum dot light converting material 210. The light coupling material 214 is also formed over the light conditioning material 212 in this case. The light coupling material is a material that minimizes optical losses due to total internal reflection in the quantum dot light converting materials 210 and in the light conditioning material 212. The device 200 typically includes a top 216, as shown in FIG. 2C, which seals the device 200 from environmental effects. This top 216 might include multiple layers, for example a glass substrate and a color filter.

The light coupling material 214 is a polymeric material that is formed by applying a precursor in liquid form to the surface of the quantum dot light converting materials 210 and the light conditioning material 212 and then solidifying the precursor. The light coupling material 214 may be a thin layer that is optically clear and has refractive index lower than the subjacent material, in this case the quantum dot light converting material 210 and the light conditioning material 212. In such cases, the light coupling material 214 has a thickness no more than about 100 nm.

Fora thicker layer of light coupling material 214, a high refractive index material is useful for light coupling. Optically clear, high refractive index, polymeric materials can be made by polymerizing materials that have aromatic components and/or hetero-atoms. Optical clarity can be expressed in terms of light absorption or transmission and haze. Each of these parameters is a function of path length through the material, so thickness of the light coupling material is a consideration for optical clarity. The layer of light coupling material 214 is, in most cases, less than about 20 μm thick. In such a layer, the light coupling material 214 is made of a material that transmits at least 85% of photons having wavelength from 450 nm to 850 nm. Additionally, such a layer of light coupling material for these embodiments has transmission haze less than about 3%.

The light coupling material 214 can also be deposited by inkjet printing for direct patterned deposition, or by slot-die-coating or spin-coating followed by subsequent patterning. Direct patterned deposition allows optical properties of individual subpixels to be selected such that the light coupling material 214 can have different transmission spectrum, for example, in different subpixels. Inkjet printing is capable of providing such deposition.

Polymeric materials that can be used for light coupling materials can include sulfur, phosphorus, nitrogen, silicon, germanium, bromine, fluorine, and chlorine as hetero-atoms. The light coupling material may be, or may include an acrylic polymer, a styrenic polymer, a polyolefin (including conjugated polyolefins such as polyindenes and polynorbornenes), a nitrile polymer, a silicone, a polygermoxane, a polygermanosiloxane, a polyorganosiloxane, a polyethylene terephthalate, a polycarbonate, a polysulfone, an epoxy resin, a polythiophene, or a polyester. Copolymers and multipolymers of the above can also be used. The various polymers contemplated above can be block, random, pseudo-block, and/or pseudo-random in any aspect of molecular structure such as composition, saturation, and tacticity. The polymers contemplated above may also be cross-linked to any desired degree. These materials commonly have refractive indices of at least about 1.5, some at least about 1.6. Examples of monomers that can be polymerized, alone or in mixtures, to form light coupling materials include the following:

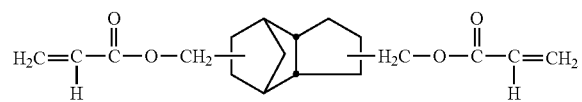

tricyclodecane dimethanol diacrylate, polymer refractive index of 1.51;

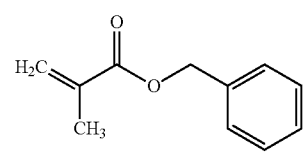

benzyl methacrylate, polymer refractive index of 1.51;

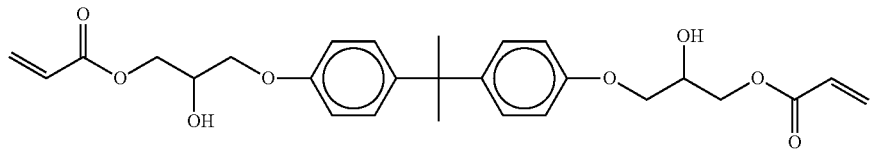

bis-phenol-A epoxydiacrylate, polymer refractive index of 1.55;

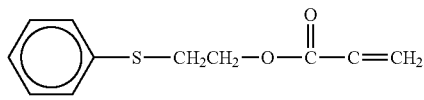

phenylthiolethyl acrylate, polymer refractive index of 1.56;

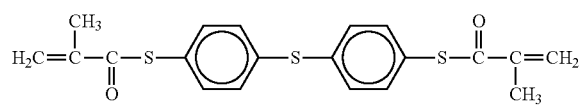

bis(methacrylolthiophenyl) sulfide, polymer refractive index of 1.66;

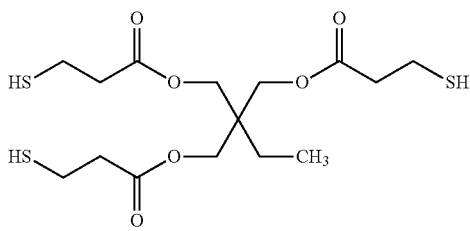 [SMILES: CCC(COC(=O)CCS)(COC(=O)CCS)COC(=O)CCS]

Trimethylolpropane tris(3-mercaptopropionate), polymer refractive index 1.52;

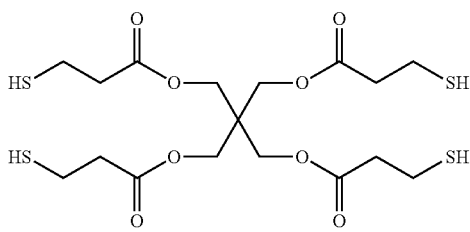 [SMILES: O=C(CCS)OCC(COC(=O)CCS)(COC(=O)CCS)COC(=O)CCS]

Pentaerythritol tetrakis(3-mercaptopropionate), polymer refractive index 1.53; and

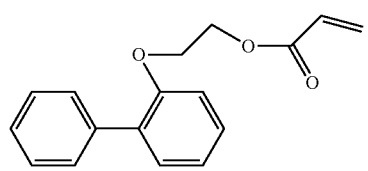 [SMILES: C=CC(=O)OCCOc1ccccc1-c1ccccc1]

ethoxylated phenylphenol acrylate, polymer refractive index 1.577.

Monomers or pre-polymers of the above example materials, or any of the materials listed above, may be mixed with a polymerization initiator in a liquid mixture for application to a substrate. Functionalized high refractive index ceramic particles can also be used with the material described herein. Solvents may be used to target density and viscosity for application of the liquid mixture for ease of application. Such materials may be applied to a substrate using any convenient method. Such methods include spin coating, ribbon coating, spraying, and inkjet printing, each of which will have optimal liquid properties that facilitate application of the material to a substrate.

The precursor material is applied to the substrate as a liquid, and then solidified to form the light coupling material. In the embodiment of FIG. 2C, layers above the light coupling material may be applied as liquid materials and solidified, or may be laminated onto the light coupling material. If the layers above the light coupling material are applied in liquid form and then solidified, the precursor material may be solidified, or partially solidified, before forming the subsequent layers. If the layers above the light coupling material are laminated onto the light coupling material, the precursor material may be slightly solidified, or thickened, before applying the subsequent layers, or the subsequent layers may be laminated onto the precursor material before solidifying the precursor material.

Solidifying the precursor material to form the light coupling material is done by drying or curing the precursor material. During a drying operation, the substrate may be warmed up to about 40° C. to encourage drying. Alternately, in some cases the substrate may be cooled during drying, or prior to drying, to prevent excessive temperature from adversely affecting heat-sensitive components in the substrate. In such cases, cooling may be applied to the substrate to reduce substrate temperature below about 40° C., or even below room temperature, for example about 15° C., during evaporative drying.

When the precursor material includes minimally reactive, or non-reactive, polymer expanded in solvent to form a liquid precursor, the solvent can be evaporated to solidify the precursor. Solvent evaporation can be performed under vacuum, or reduced pressure, optionally while heating or cooling the precursor material. In the case where a polymer in solvent is applied as a liquid, and then a top is laminated onto the precursor, the precursor can be partially dried, for example 25-50% of the solvent can be evaporated, prior to applying the laminate layer to provide a thick, tacky surface material for receiving the laminate layer. The precursor material can then be completely dried to finish adhering the laminate layer to the light coupling material. When subsequent layers are applied and then solidified, the precursor material of the light coupling material is substantially solidified, for example at least 80% of the solvent is evaporated, prior to subsequent application of a new liquid precursor.

In a curing process, the precursor material typically includes a polymerization initiator or accelerator. Freeradical initiators are commonly used, and may be activated using thermal or radiant energy, or both.

Figure 3:
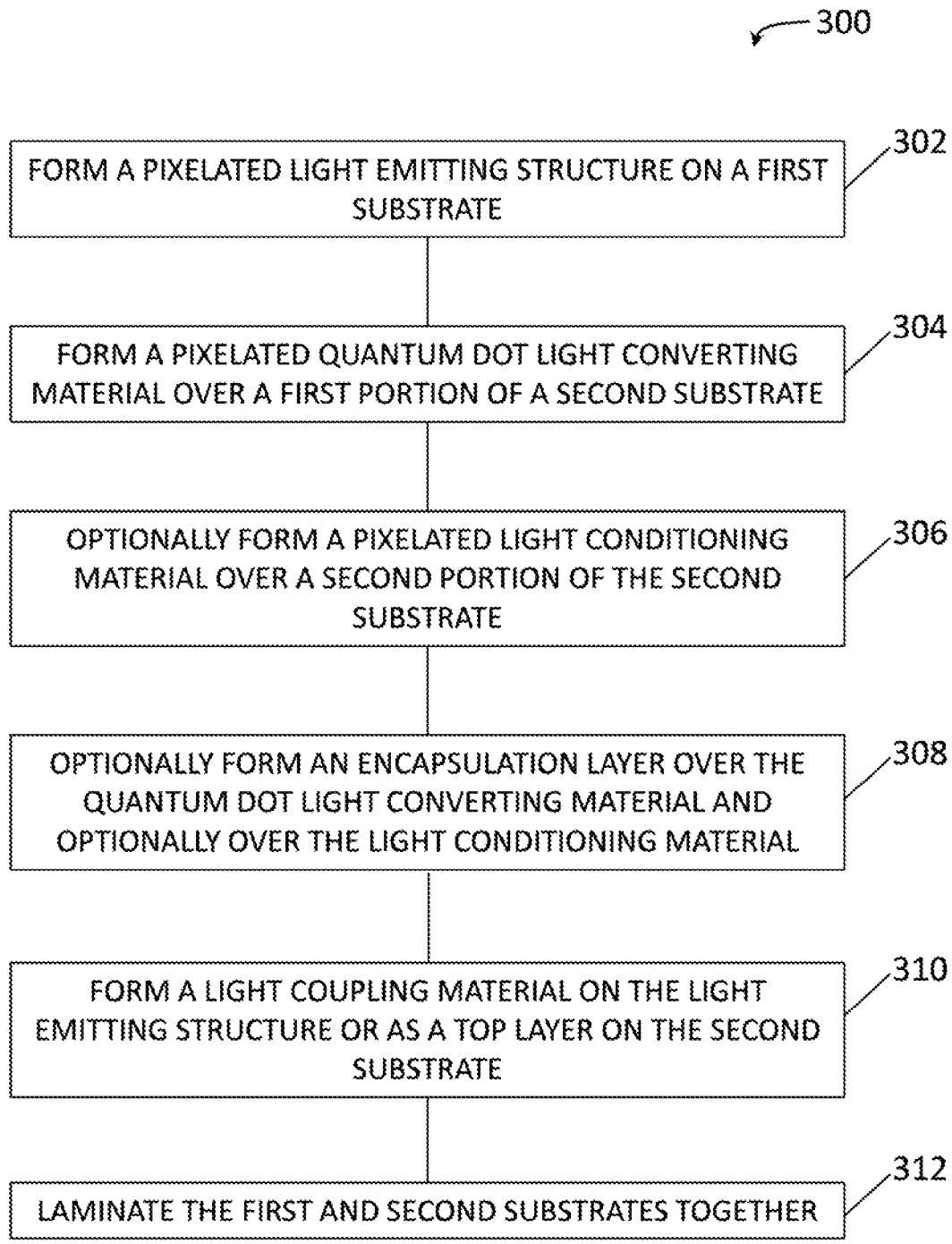
FIG. 3 is a flow diagram summarizing a method according to another embodiment.

FIG. 3 is a flow diagram summarizing a method 300 according to another embodiment. The method 300 is also a method of making a display device. In the method 300, the light emitting part of the device and the light converting part of the device are made separately and laminated together. FIGS. 4A-4E show stages in the assembly of a display device 400, shown fully assembled in FIG. 4E, according to the method 300. Light coupling layers are used in the device 400 to facilitate photon transmission through the device.

Figure 4A:
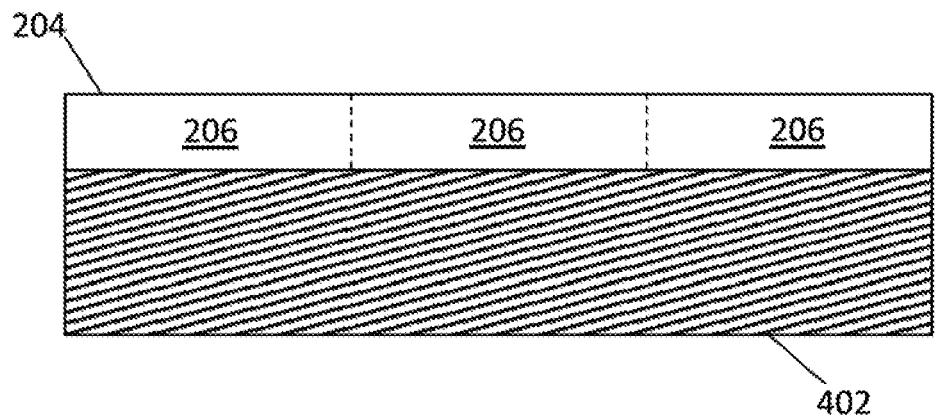
FIGS. 4A-4E are schematic cross-sectional views of a display device embodiment being manufactured according to the method of FIG. 3.

At 302, a pixelated light emitting structure is formed on a first substrate, as in operation 102 of FIG. 1. FIG. 4A shows the first substrate 402, with the light emitting structure 204 and defined subpixels 206, as in FIG. 2A. The first substrate 402 and light emitting structure 204 form a first part 410 of the device formed by the method 300, which is shown fully assembled in FIG. 4E. A light coupling material may optionally be formed on the light emitting structure as a planarization layer to facilitate final assembly of the display device.

Figure 4B:
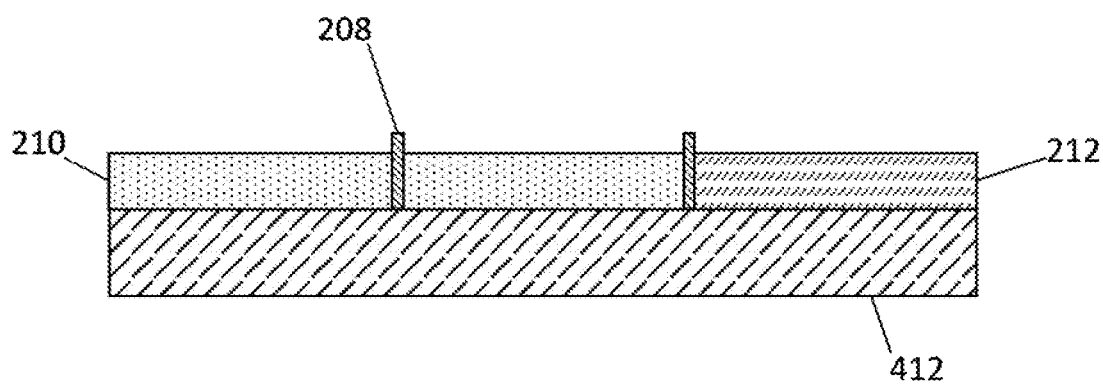
Figure 4C:
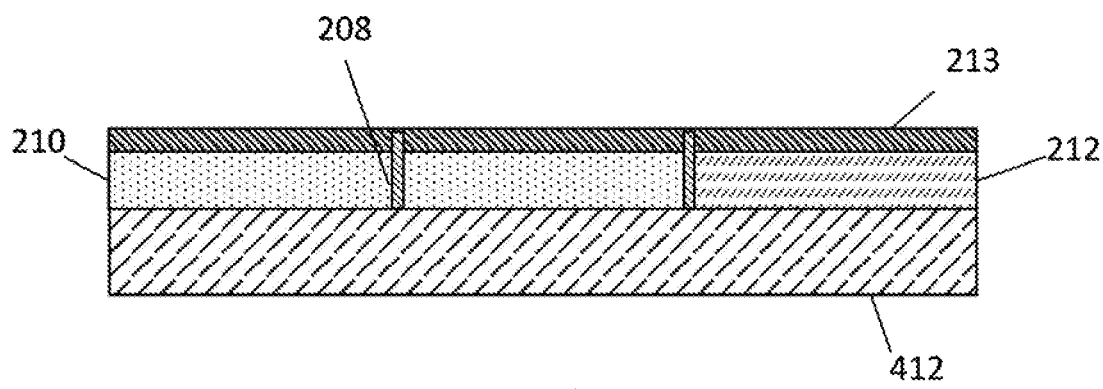

At 304, a pixelated quantum dot light converting material is formed on a first portion of a second substrate. FIG. 4B shows the second substrate 412 with a pixel definition provided by partitions 208. The pixelated quantum dot light converting material 210 is formed here in a process similar to operation 104 above.

At 306, a pixelated light conditioning material is optionally formed on a second portion of the second substrate. FIG. 4B also shows the light conditioning material 212 formed on the second substrate 412, using the partitions 208 as pixel definition. As noted above, in some cases the quantum dot light converting material may be formed in all the pixels if color conversion is needed for all pixels.

At 308, an optional encapsulation layer 213 is formed over the quantum dot light converting material 210 and the light conditioning material 212. The encapsulation layer 213 is as described above and serves to prevent adverse effects on sensitive components of the quantum dot and light converting materials from subsequent processing.

Figure 4D:
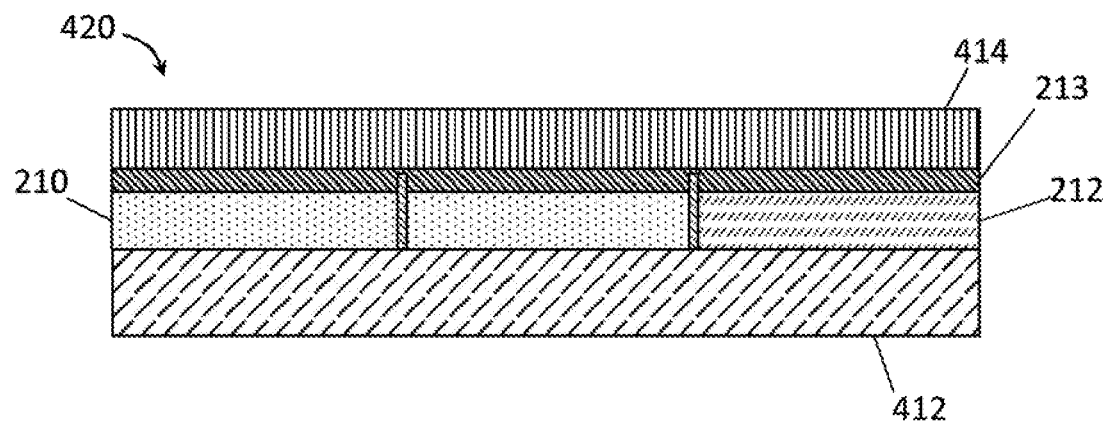

At 310, a light coupling material is formed on the light emitting structure or as a top layer on the second substrate. The light coupling material is formed on the encapsulation layer 213. FIG. 4D shows the light coupling material 414 formed on the encapsulation layer 213. The light coupling material 414 can be formed as described above in connection with the method 100, and may be the same material as the optional light coupling material described above, or may be a different material.

Figure 4E:
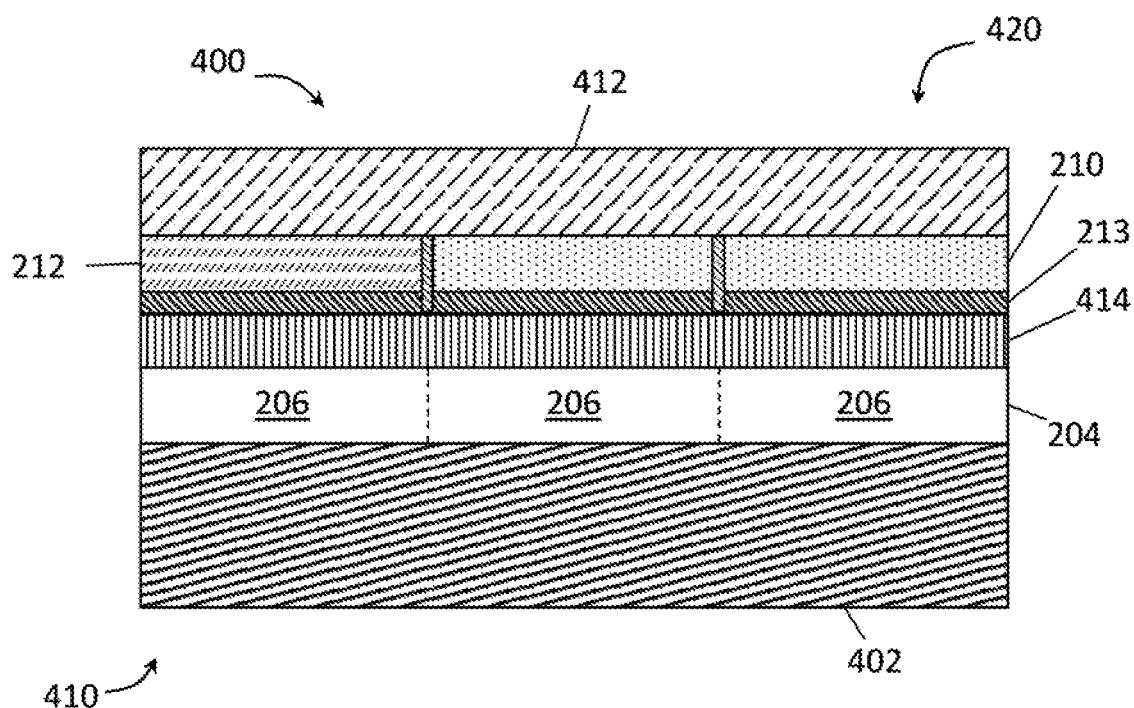

The second substrate 412 with the quantum dot material 210, the light conditioning material 212, and the light coupling material 414 form a second part 420, as shown in FIG. 4D. At 312, the top layer of the second part 420 is attached to the top layer of the first part 410. If a light coupling material is used on the first part 410, the light coupling material of the first part 410 can be laminated to the encapsulation layer 213 of the second part 420. If no light coupling material is used in the first part 410, the light coupling material of the second part 420 is attached to the pixelated light emitting structure of the first part 410. FIG. 4E shows the first part 410 attached to the second part 420. In this case, the light coupling material 414 of the second part 420 is attached directly to the light coupling material 404 of the first part 410, such that the light coupling material 414 is between the light emitting structure 204 and the quantum dot light conversion material 210, and between the light emitting structure 204 and the light conditioning material 212. Lamination of the first part 410 to the second part 420 is facilitated by the smooth surfaces of the light coupling material 414 of the second part 420 and the light emitting structure 204 of the first part 410. The light coupling material 204 serves as a planarization layer of the second part 420 to facilitate lamination.

The two parts 410 and 420 are attached by a laminating process. Here, the surface of the light coupling material 414 of the second part 420 is adhered to the surface of the light emitting structure 204 of the first part 410. Alternately, if no light coupling material is used for the first part 410, a light coupling material can be formed on the surface of the light emitting structure 204 of the first part 410, and can be used to laminate to the encapsulation layer 213 of the second part 420. In either case, a light coupling material is provided between the light emitting structure 204 of the first part 410 and the quantum dot light converting material 210, and between the light emitting structure 204 of the first part 410 and the light conditioning material 212. Adhesion is achieved by bringing the surface of the light coupling material 414 into contact with the surface of the material to be laminated to the light coupling material 414 (either the light emitting structure 204 or encapsulation layer 213). In one case, solidification of the light coupling material 414 is only partially completed before laminating the two parts together, and then the solidification of the light coupling material 414 is completed after contact. In another case, a pre-solidified light coupling material 414 is softened, by either heating or using solvent, before contact with the first part 410. In a third case, an adhesive is applied to the surface of the light coupling material 414 or to the surface to be laminated to the light coupling material 414 before contact. In any event, lamination of the two parts 410 and 420 together results in the final display device 400 shown in FIG. 4E. It should be noted that, where light coupling materials are used for both parts 410 and 420, both light coupling materials can be prepared for lamination by heating, softening in solvent, or application of an adhesive, and the two parts can be prepared using different methods (i.e. adhesive on one part, heat on the other, etc.). In the case where two light coupling materials are used to form a laminated device, the two light coupling materials may have different properties and different thicknesses. For example, a first light coupling material can have a first refractive index, and may be applied to a first thickness, and a second light coupling material can have a second refractive index, and may be applied to a second thickness.

The light coupling materials used in the device of FIG. 4E may be birefringent. For example, block SBS copolymers can be oriented to have birefringence. In such cases, the birefringent light coupling material will be oriented such that the transmission refractive index of the light coupling material in the light transmission direction (i.e. generally perpendicular to the light emitting surface of the light emitting structure) is higher than the transverse refractive index in a direction transverse to the transmission direction.

Multiple layers of light coupling material can be used in some cases. For example, in the embodiment of FIG. 4E, three light coupling layers could be interposed between the light emitting structure 204 and the encapsulation layer 213. The light coupling layers can have refractive indices that progress upward or downward with each successive layer. Any number of such materials can be used, if desired, to create a layer of material having a gradient of refractive index from one surface to the other of the layer. In the embodiment of FIG. 4E, the layer might have a first surface adjacent to the light emitting structure 204 and a second surface adjacent to the encapsulation layer 213. In this case, the layer could be configured to have a first refractive index adjacent to the first surface and a second refractive index adjacent to the second surface, where the first refractive index is lower than the second refractive index, and where the refractive index of the layer varies from the first surface to the second surface in a continuous, quasi-continuous, linear, or quasi-linear manner.

Figure 5:
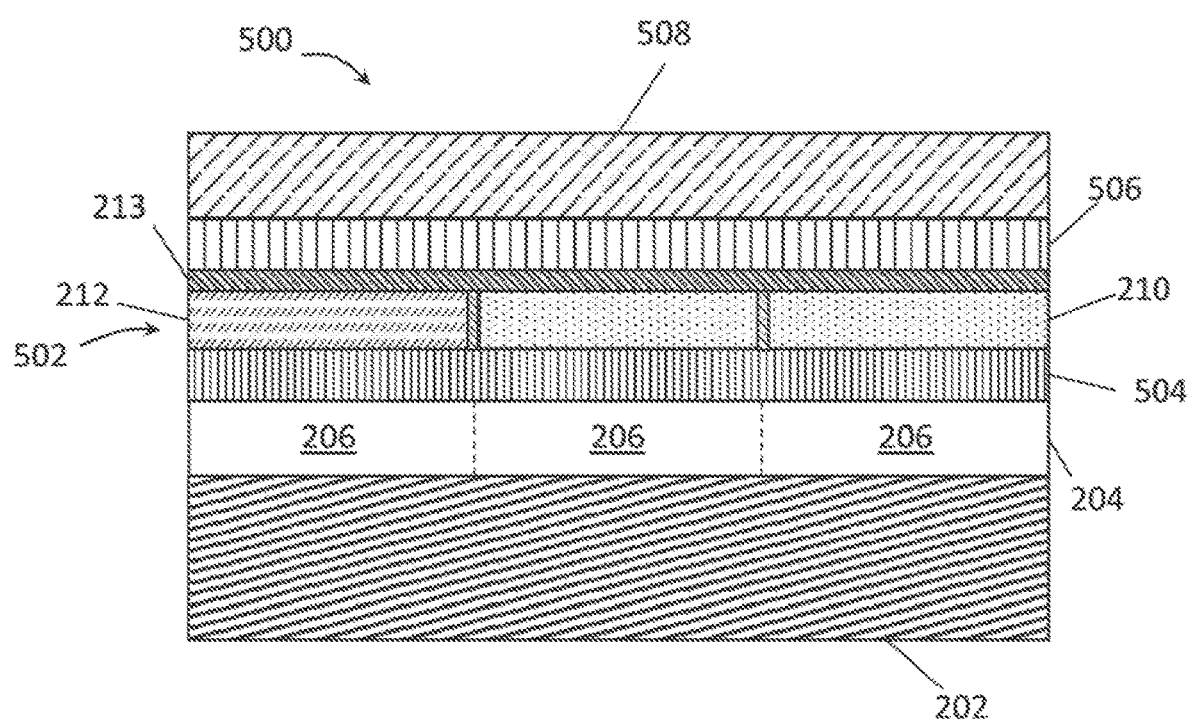
FIG. 5 is a schematic cross-sectional view of a display device according to another embodiment.

Multiple light coupling materials can also be used at different locations in a device structure. In the device of FIG. 4E, a light coupling layer could be included between the substrate 402 and the light emitting structure 204 to improve light coupling between the light emitting structure 204 and the substrate. Such a light coupling layer could increase efficiency of the device of FIG. 4E. FIG. 5 is a schematic cross-sectional view of a device 500 according to another embodiment. The device 500 has the substrate 202, the light emitting structure 204, and a light configuration layer 502 comprising a plurality of quantum dot light conversion areas 210 and light conditioning areas 212 (only one light conditioning area 212 is shown). A first light coupling layer 504 is disposed between the light emitting structure 204 and the light configuration layer 502. The first light coupling layer 504 optimizes light input to the light configuration layer 502. An encapsulation layer 213 is disposed on the light configuration layer 502. A second light coupling layer 506 is disposed on the light encapsulation layer 213, and a light transmissive top 508 is disposed on the second light coupling layer 506. The first and second light coupling layers 504 and 506 minimize optical loss due to total internal reflection in the various functional layers of the device 500. Each of the first and second light coupling layers 504 and 506 has a refractive index of at least 1.5, in some cases at least 1.6, to maximize light coupling into adjacent layers. The materials listed above for light coupling layers can be used here. The materials of the first and second light coupling layers 504 and 506 can be the same or different. The first light coupling layer 504 has a first refractive index, and the second light coupling layer 506 has a second refractive index. In some cases, the second refractive index is higher than the first refractive index, but the two refractive indices may be the same or substantially the same. Either of the first light coupling layer 504 or the second light coupling layer 506, or both, may be birefringent.

It should be noted that the various substrates and layers described for the various display devices mentioned herein may include a number of functional layers. In addition to the functional layers described above in connection with the light emitting structure, polarization layers, filter layers, protective layers, anti-reflection layers, sealing layers, buffer layers, barrier layers, and the like may be used at any location in the display device. In some cases, light filter layers may be used to equalize light intensity across the device. For example, when blue light emitting structures are used as the photon source, a blue color filter may be used between the quantum dot light converting layer and the light coupling material or other layers on the output side of the quantum dot light converting layer. The blue color filter may also be used in connection with the light conditioning layer. The blue color filter generally reduces the intensity of blue light escaping through the device to equalize blue intensity with red and green intensity and to maximize color fidelity of the red and green pixels. The blue color filter material, for example the blue dye used for blue color filtering, may also be included in the quantum dot materials.

In other cases, a UV filter can be included between the substrate and the quantum dot layer to minimize excitation of the quantum dots by ambient light.

A light coupling layer between the substrate and the quantum dot layer can incorporate both blue filter characteristics as well as UV filter characteristics. Further, the light coupling layer can be pixelated such that the optical properties and filter properties of the light coupling layer are tailored to the type of subpixel subjacent to the light coupling layer. Inkjet printing is an advantageous method of forming such structures.

As noted above, the light coupling layers described above generally have refractive index intermediate between neighboring layers. In many display devices, as noted above, an ITO material is used as a transparent electrode. A glass or polymer top layer is also frequently used. Refractive index of materials generally declines from the ITO material to the top layer, causing potential photon loss at material interfaces. Use of high refractive index light coupling materials can reduce photon loss at the interfaces by reducing abrupt transition from high to low refractive index across the interface.

While the foregoing is directed to embodiments of the present invention, other and further embodiments of the present disclosure may be devised without departing from the basic scope thereof, and the scope thereof is determined by the claims that follow.

What is claimed is:

1. A display comprising:
   an array of blue light emitting elements formed in a pixel structure having subpixels;
   a plurality of quantum dot light converting materials disposed on a portion of the subpixels; and
   a light coupling material having a refractive index of at least 1.6 formed on top of the quantum dot light converting materials.

2. The display of claim 1, wherein the light coupling material is a polymer that includes aromatic components or hetero-atoms.

3. The display of claim 2, wherein the polymer is an acrylic polymer, a styrenic polymer, a polyolefin, a nitrile polymer, a silicone, a polyethylene terephthalate, a polycarbonate, a polysulfone, an epoxy resin, a polythiophene, or a polyester.

4. The display of claim 3, wherein the polymer includes aromatic components and hetero-atoms.

5. The display of claim 2, wherein at least one aromatic component of the polymer includes one or more hetero-atoms.

6. The display of claim 1, wherein the light coupling material or the quantum dot light converting material comprises ceramic particles, metal particles, or metal oxide particles.

7. The display of claim 1, wherein at least a portion of the light emitting elements comprise quantum well materials.

8. A display comprising:
   an array of blue light emitting elements formed in a pixel structure having subpixels;
   a light coupling material comprising aromatic components and having a refractive index of at least 1.6 disposed over the array of blue light emitting elements;
   a plurality of quantum dot light converting materials disposed on a portion of the sub-pixels; and
   a light transmissive top formed over the quantum dot light converting materials.

9. The display of claim 8, wherein the light coupling material is an acrylic polymer, a styrenic polymer, a polyolefin, a nitrile polymer, a silicone, a polyethylene terephthalate, a polycarbonate, a polysulfone, an epoxy resin, a polythiophene, or a polyester that includes hetero-atoms.

10. The display of claim 8, wherein at least one aromatic component of the polymer includes one or more hetero-atoms.

11. The display of claim 8, wherein the light coupling material is disposed between the light emitting elements and the quantum dot light converting materials.

12. The display of claim 8, wherein the light coupling material is a first light coupling material, and further comprising a second light coupling material between the quantum dot light converting material and the top.

13. The display of claim 8, wherein the portion of the subpixels where the quantum dot light converting materials are disposed is a first portion, and further comprising a light conditioning material disposed in a second portion of the subpixels, wherein the light coupling material is also disposed between the light conditioning material and the pixelated array of blue light emitting elements.

14. The display of claim 13, wherein the light coupling material, the light conditioning material, or the quantum dot light converting materials comprise ceramic particles, metal particles, or metal oxide particles.

15. A method of making a display, comprising:
    forming a pixelated blue light emitting structure on a first substrate;
    forming a patterned layer of quantum dot materials on a first portion of a second substrate;
    forming a patterned layer of light conditioning material on a second portion of the second substrate;
    forming a light coupling material having aromatic components, hetero atoms, or both, and a refractive index of at least 1.6 over the quantum dot material and the light conditioning material; and
    attaching the light coupling material of the second substrate to the pixelated blue light emitting structure of the first substrate.

16. The method of claim 15, wherein the quantum dot materials, the light conditioning material, and the light coupling material are formed using inkjet printing.

* * * * *